(12) United States Patent
Iikura et al.

(10) Patent No.: US 9,915,684 B2
(45) Date of Patent: Mar. 13, 2018

(54) SIGNAL PROCESSING CIRCUIT AND SENSOR SYSTEM

(71) Applicant: ALPS ELECTRIC CO., LTD., Tokyo (JP)

(72) Inventors: Akihisa Iikura, Miyagi-ken (JP); Tomoyuki Sawataishi, Miyagi-ken (JP)

(73) Assignee: Alps Electric Co., Ltd., Tokyo (JP)

(*) Notice: Subject to any disclaimer, the term of this patent is extended or adjusted under 35 U.S.C. 154(b) by 505 days.

(21) Appl. No.: 14/603,182

(22) Filed: Jan. 22, 2015

(65) Prior Publication Data
US 2015/0241197 A1    Aug. 27, 2015

(30) Foreign Application Priority Data
Feb. 24, 2014   (JP) .................. 2014-032862

(51) Int. Cl.
*G01B 7/14*    (2006.01)
*G01R 13/02*    (2006.01)
*G01D 5/244*    (2006.01)

(52) U.S. Cl.
CPC ..... *G01R 13/0218* (2013.01); *G01D 5/24466* (2013.01); *G01D 5/24476* (2013.01)

(58) Field of Classification Search
CPC .......... G01R 13/0218; G01D 5/24466; G01D 5/24476; G01D 5/145; H03K 19/018528; H03K 3/3565; H03K 5/2481; G01P 3/487
USPC .......... 702/71, 1; 327/306, 65, 205; 324/63, 324/207
See application file for complete search history.

(56) References Cited

U.S. PATENT DOCUMENTS 9,046,383  B2 *  6/2015  Friedrich
2013/0027107 A1    1/2013  Nohara
2015/0283387 A1 *  10/2015  Sun ...................... A61B 5/0452
                                                              607/27

* cited by examiner

*Primary Examiner* — Roy Y Yi
*Assistant Examiner* — Jeffrey Aiello
(74) *Attorney, Agent, or Firm* — Beyer Law Group LLP

(57) ABSTRACT

A sensor detects the rotation of a component (object) of a vehicle in a non-contact manner, and generates a differential signal according to the rotation. Two comparators have different hysteresis characteristics. At both edges of one signal that is an output of one of the comparators, if a signal of the other comparator is not at the same level, it is determined that a distance (gap) between an object and the sensor is within a predetermined range in which the differential signal is effective.

8 Claims, 4 Drawing Sheets

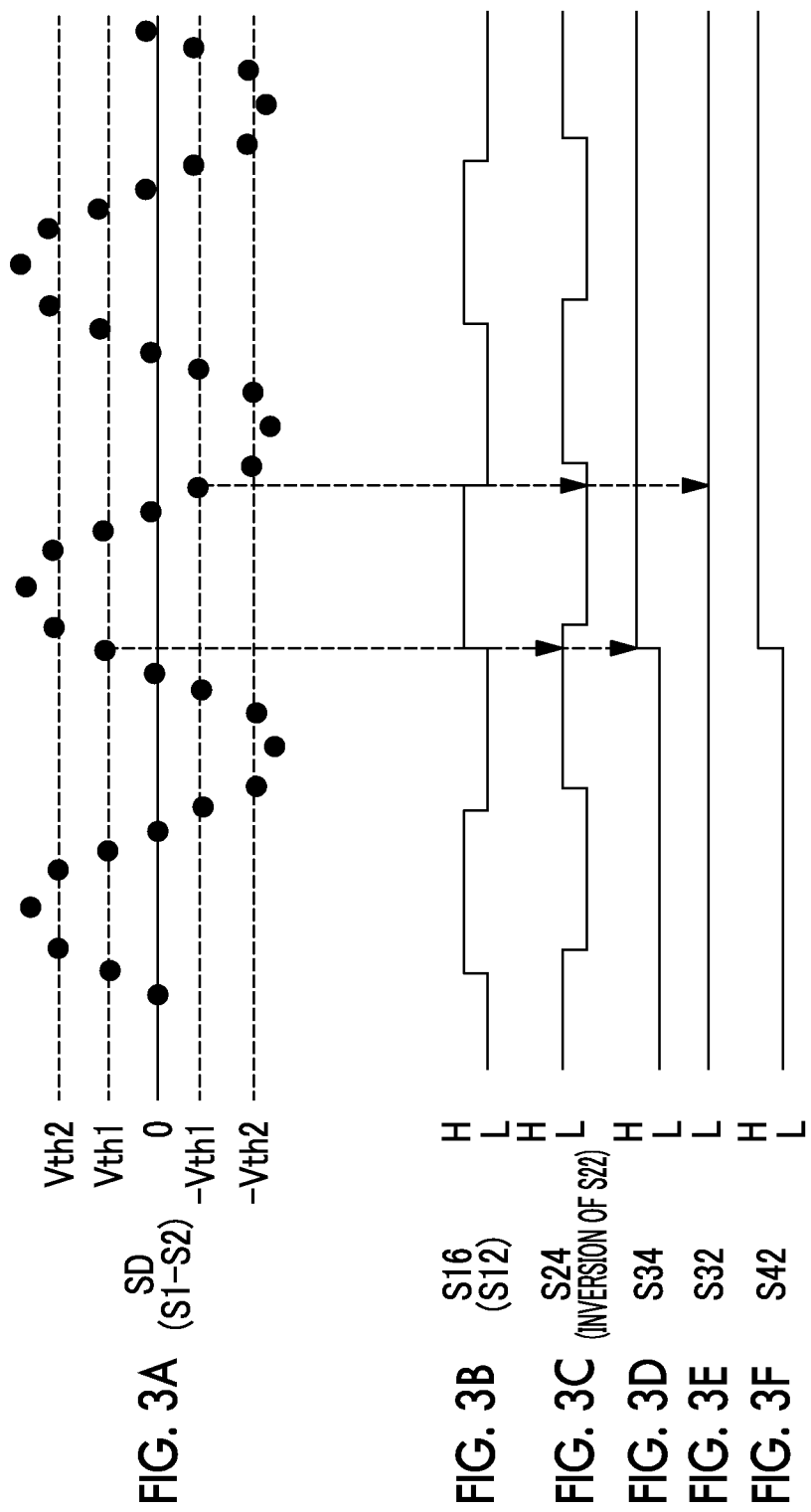

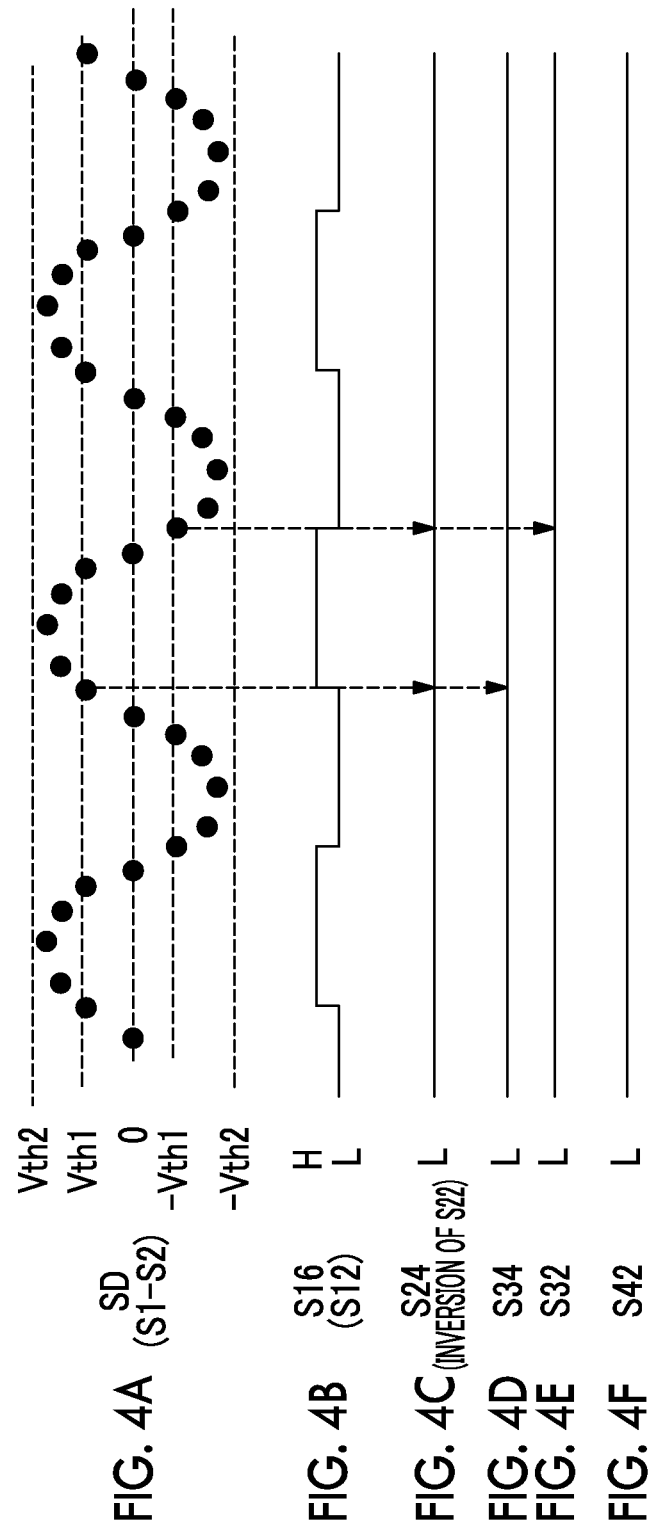

SIGNAL PROCESSING CIRCUIT AND SENSOR SYSTEM

CLAIM OF PRIORITY

This application claims benefit of Japanese Patent Application No. 2014-032862 filed on Feb. 24, 2014, which is hereby incorporated by reference.

BACKGROUND OF THE INVENTION

1. Field of the Invention

The present invention relates to a signal processing circuit used to determine whether or not the signal level is within a predetermined width and a sensor system using the signal processing circuit.

2. Description of the Related Art

For example, in order to maintain detection accuracy, a sensor system that detects the rotation of an object used in a safety device of a vehicle in a non-contact manner has a function of generating an error signal when a distance (gap) between the sensor system and the object is out of a predetermined range. In such a sensor system, an analog digital converter (ADC) is required in order to detect a reduction (difference) in the sensor output according to the distance.

However, in the case of detecting a gap using the ADC, the circuit size can be reduced by using a sample and hold circuit, but there is a problem that continuous measurement is not possible and accordingly this is not suitable for high-speed processing. In addition, in a circuit that does not use a sample and hold circuit, such as a flash type AD conversion circuit, there is a problem that the circuit size becomes large even though high-speed processing is possible.

SUMMARY OF THE INVENTION

The present invention provides a signal processing circuit capable of determining whether or not the amplitude of a differential signal satisfies predetermined conditions with a small-scale structure and at high speed. In addition, the present invention provides a sensor system capable of determining whether or not a distance between an object and a sensor satisfies predetermined conditions with a small-scale structure and at high speed.

According to an aspect of the present invention, there is provided a signal processing circuit including: a first comparator that compares first and second signals, which form a differential signal, and outputs a first output signal according to the comparison result and that has a hysteresis characteristic; a second comparator that compares the first and second signals and outputs a second output signal according to the comparison result and that has a different hysteresis characteristic from the hysteresis characteristic of the first comparator; and a signal generating circuit that generates a determination signal for determining whether or not amplitude of the differential signal satisfies predetermined conditions based on the first and second output signals.

In the signal processing circuit according to the aspect of the present invention, the first comparator compares the first and second signals that form a differential signal, and outputs the first output signal according to the comparison result. The second comparator compares the first and second signals, and outputs the second output signal according to the comparison result. The signal generating circuit generates a determination signal for determining whether or not the amplitude of the differential signal satisfies predetermined conditions based on the first and second output signals.

In the signal processing circuit according to the aspect of the present invention, since the hysteresis characteristics of the first and second comparators are different, the signal generating circuit can generate a determination signal for determining whether or not the amplitude of the differential signal satisfies predetermined conditions based on the first and second output signals. Therefore, it is possible to generate the determination signal with a simple configuration allowing high-speed processing.

Preferably, in the signal processing circuit according to the aspect of the present invention, a width of the hysteresis in the first comparator is narrower than that in the second comparator, and the signal generating circuit generates the determination signal based on a level of the second output signal at rising and falling timings of the first output signal.

In the signal processing circuit according to the aspect of the present invention, the signal generating circuit can generate the determination signal based on the level of the second output signal at the rising and falling timings of the first output signal with a simple configuration allowing high-speed processing.

Preferably, in the signal processing circuit according to the aspect of the present invention, the first comparator inverts a logic level of the first output signal when the first signal becomes higher than a first threshold value compared with the second signal, and inverts the logic level of the first output signal when the second signal becomes higher than a second threshold value compared with the first signal, and the second comparator inverts a logic level of the second output signal when the first signal becomes higher than a third threshold value higher than the first threshold value compared with the second signal, and inverts the logic level of the second output signal when the second signal becomes higher than a fourth threshold value higher than the second threshold value compared with the first signal.

In the signal processing circuit according to the aspect of the present invention, the threshold value of the second comparator is set to be larger than the threshold value of the first comparator. Therefore, it is possible to acquire and compare the logic level of the second output signal with the rising and falling edges of the first output signal of the first comparator as a trigger.

Preferably, in the signal processing circuit according to the aspect of the present invention, the signal generating circuit generates the determination signal that has a predetermined logic level when a logic level of the second output signal at a rising timing of the first output signal is different from a logic level of the second output signal at a falling timing of the first output signal.

In the signal processing circuit according to the aspect of the present invention, when the amplitude of the differential signal exceeds a threshold value for inverting the comparison results of both of the first and second comparators, the first and second output signals of the first and second comparators become signals that periodically switch the logic levels according to the comparison results. In this case, between the first and second output signals, at both edges of the output signal of one comparator with the low threshold value, the level of the output signal of the other comparator is not the same.

Therefore, the signal generating circuit can generate a determination signal for determining whether or not the amplitude of the differential signal satisfies predetermined conditions based on the first and second output signals.

Since it is not necessary to use a sample and hold circuit by generating the determination signal as described above, it is possible to perform high-speed processing. Unlike the flash type ADC, since input signals having the same level are input to a plurality of comparators, there is little influence due to the performance difference between the comparators. In addition, since the input signal is not divided, there is little influence of noise.

Preferably, in the signal processing circuit according to the aspect of the present invention, the signal generating circuit includes: a first flip-flop circuit including a first clock pulse terminal to which an inverted signal of the first output signal is input, a first data input terminal to which an inverted signal of the second output signal is input, and a first output terminal; a second flip-flop circuit including a second clock pulse terminal to which the first output signal is input, a second data input terminal to which an inverted signal of the second output signal is input, and a second output terminal; and a logic circuit that outputs the determination signal indicating an exclusive OR of an output signal from the first output terminal and an output signal from the second output terminal.

According to another aspect of the present invention, there is provided a sensor system including: a sensor that detects rotation of an object in a non-contact manner and generates first and second input signals that form a differential signal according to the detection; a first comparator that compares the first and second signals and outputs a first output signal according to the comparison result and that has a hysteresis characteristic; a second comparator that compares the first and second signals and outputs a second output signal according to the comparison result and that has a different hysteresis characteristic from the hysteresis characteristic of the first comparator; and a signal generating circuit that generates a determination signal for determining whether or not amplitude of the differential signal satisfies predetermined conditions based on the first and second output signals.

BRIEF DESCRIPTION OF THE DRAWINGS

FIGS. 3A to 3F are waveform diagrams of respective signals of the gap detection circuit shown in FIG. 1 when the voltage level of a differential signal exceeds a threshold value Vth2; and FIGS. 4A to 4F are waveform diagrams of respective signals of the gap detection circuit shown in FIG. 1 when the voltage level of a differential signal exceeds a threshold value Vth1 but does not exceed a threshold value Vth2.

DESCRIPTION OF THE PREFERRED EMBODIMENTS

Figure 1:
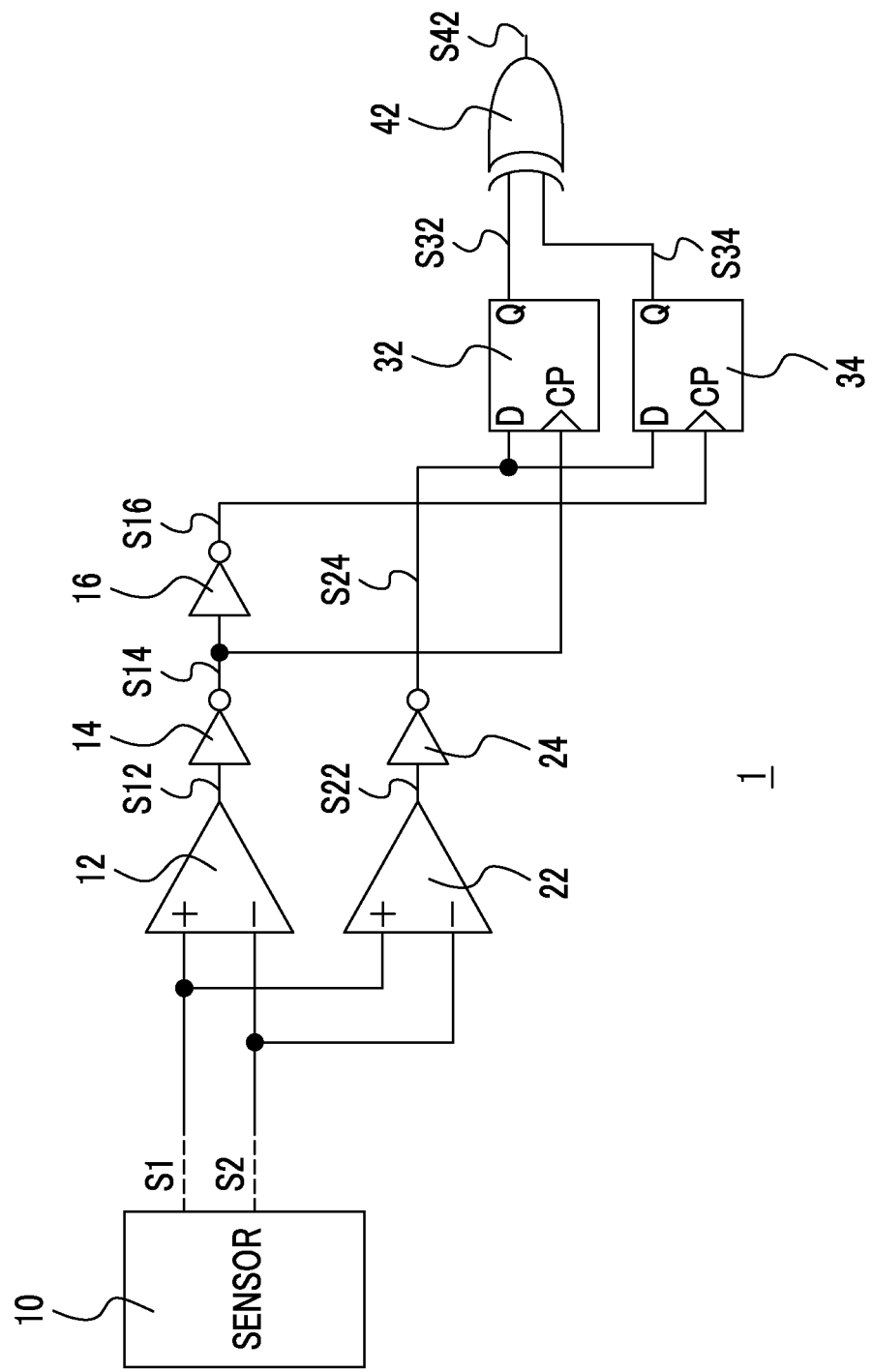
FIG. 1 is a diagram showing the configuration of a gap detection circuit according to an embodiment of the present invention.

Hereinafter, a gap detection circuit according to an embodiment of the present invention will be described. FIG. 1 is a diagram showing the configuration of a gap detection circuit 1 according to the embodiment of the present invention.

As shown in FIG. 1, the gap detection circuit 1 includes comparators 12 and 22, NOT circuits 14, 16, and 24, D-Flip Flop (FF) circuits 32 and 34, and an Exclusive OR (XOR) circuit 42. The comparator 12 is an example of a first comparator of the present invention, and a comparator 22 is an example of a second comparator of the present invention. In addition, the NOT circuits 14, 16, and 24, the D-FF circuits 32 and 34, and the XOR circuit 42 are an example of a signal generating circuit of the present invention.

A sensor 10 is a sensor that detects the rotation of a component (object) of a vehicle in a non-contact manner, and generates a differential signal formed of signals S1 and S2 according to the rotation and outputs the differential signal to the gap detection circuit 1. In this case, since the object performs rotational movement, the differential signal between the signals S1 and S2 is a sine wave. Here, the signal S1 is an example of a first signal of the present invention, and the signal S2 is an example of a second signal of the present invention. The gap detection circuit 1 determines whether or not the distance (gap) between the object and the sensor 10 is within a predetermined range, in which the differential signal is effective, based on the input differential signal.

The signal S1 from the sensor 10 is input to both (+) input terminals of the comparators 12 and 22. The signal S2 from the sensor 10 is input to both (−) input terminals of the comparators 12 and 22. The output terminal of the comparator 12 is connected to the input terminal of the NOT circuit 14. The output terminal of the comparator 22 is connected to the input terminal of the NOT circuit 24.

Figure 2:
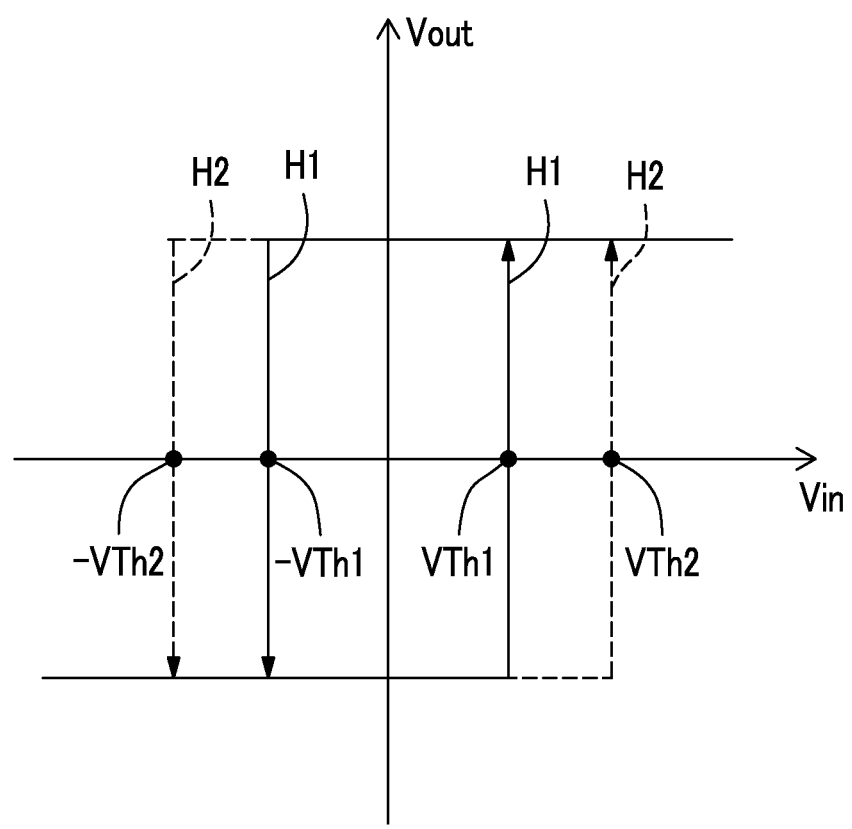
FIG. 2 is a diagram for explaining the hysteresis characteristic of each comparator shown in FIG. 1.

The comparator 12 has a hysteresis characteristic H1 shown in FIG. 2. When the signal S1 becomes higher than a threshold value Vth1 compared with the signal S2, the comparator 12 increases the voltage level of an output signal S12 based on a difference (comparison) signal SD (S1−S2) between the signal S1 input to the (+) input terminal and the signal S2 input to the (−) input terminal. When the signal S2 becomes higher than the threshold value Vth1 compared with the signal S1, the comparator 12 reduces the voltage level of the output signal S12 based on the differential signal SD. The comparator 12 outputs the signal S12 to the NOT circuit 14.

The comparator 22 has a hysteresis characteristic H2 shown in FIG. 2. When the signal S1 becomes higher than a threshold value Vth2 compared with the signal S2, the comparator 12 increases the voltage level of an output signal S22 based on the differential signal SD. When the signal S2 becomes higher than the threshold value Vth2 compared with the signal S1, the comparator 22 reduces the voltage level of the output signal S22 based on the differential signal SD. The comparator 22 outputs the signal S22 to the NOT circuit 24.

In FIG. 2, the threshold value Vth1 is an example of a first threshold value of the present invention, a threshold value −Vth1 is an example of a second threshold value of the present invention, the threshold value Vth2 is an example of a third threshold value of the present invention, and a threshold value −Vth2 is an example of a fourth threshold value of the present invention.

The gap detection circuit 1 determines that the distance (gap) between the object and the sensor 10 is within a range, in which the differential signal is effective, if the signal S22 of the comparator 22 is not at the same level at both edges of the signal S12 that is an output of the comparator 12.

The comparator 12 has a narrow hysteresis width compared with the comparator 22. Accordingly, when the differential signal SD rises, the logic level of the signal S12 of the comparator 12 is inverted earlier than the signal S22 of the comparator 22. Even when the differential signal SD falls, the logic level of the signal S12 is inverted earlier than the signal S22. Therefore, the logic level of the signal S22 when the logic level of the signal S12 rises is necessarily different from the logic level of the signal S22 when the logic level of the signal S12 falls as long as the logic inversion of the signal S22 occurs. That is, when the amplitude of the differential signal SD exceeds the threshold value Vth2, the mismatch occurs regardless of the period of the signal S22 (speed of the rotational movement of the object).

An output terminal of the NOT circuit 14 is connected to an input terminal of the NOT circuit 16 and a clock terminal CP of the D-FF circuit 32. The NOT circuit 14 inverts the signal S12 input from the comparator 12, and outputs an inverted signal S14 to the NOT circuit 16 and the clock terminal CP of the D-FF circuit 32.

An output terminal of the NOT circuit 16 is connected to a clock terminal CP of the D-FF circuit 34. The NOT circuit 16 inverts the signal S14 input from the NOT circuit 14, and outputs an inverted signal S16 to the clock terminal CP of the D-FF circuit 34.

An output terminal of the NOT circuit 24 is connected to input terminals D of the D-FF circuit 32 and the D-FF circuit 34. The NOT circuit 24 inverts the signal S22 input from the comparator 22, and outputs an inverted signal S24 to the input terminals D of the D-FF circuit 32 and the D-FF circuit 34.

An output terminal Q of the D-FF circuit 32 is connected to one of two input terminals of the XOR circuit 42. An output terminal Q of the D-FF circuit 34 is connected to the other input terminal of the XOR circuit 42.

The D-FF circuit 32 generates the signal S32 by latching (holding) the level of the signal S24 at the rising timing of the signal S14 (falling timing of the signal S12). The D-FF circuit 34 generates the signal S34 by latching (holding) the level of the signal S24 at the rising timing of the signal S16 (falling timing of the signal S12).

The XOR circuit 42 generates a determination signal S42 indicating the exclusive OR of the signal S32 from the D-FF circuit 32 and the signal S34 from the D-FF circuit 34.

By using a comparator having the same configuration as a main circuit as the comparators 12 and 22, the comparators 12 and 22 can be made to have the same temperature characteristics. Since a relative variation is small in an integrated circuit, a certain accuracy of gap detection is possible even without adjustment.

Hereinafter, the operation of the gap detection circuit 1 shown in FIG. 1 will be described with reference to FIG. 3.

FIRST OPERATION EXAMPLE

In this operation example, a case will be described in which the distance between the sensor 10 and the object is within a predetermined range. FIGS. 3A to 3F are waveform diagrams of respective signals of the gap detection circuit 1 when the voltage level of the differential signal SD between the signals S1 and S2 exceeds the threshold value Vth2. FIG. 3A is a waveform diagram of the differential signal SD between the signals S1 and S2. FIG. 3B is a waveform diagram of the output signal S16 of the NOT circuit 16. FIG. 3C is a waveform diagram of the output signal S24 of the NOT circuit 24. FIG. 3D is a waveform diagram of the output signal S34 of the D-FF circuit 34. FIG. 3E is a waveform diagram of the output signal S32 of the D-FF circuit 32. FIG. 3F is a waveform diagram of the determination signal S42 of the XOR circuit 42.

As shown in FIG. 3A, the differential signal SD between the signals S1 and S2 from the sensor 10 has an amplitude exceeding the threshold value Vth2. As shown in FIG. 3B, when the voltage level Vin of the differential signal SD shown in FIG. 3A rises to become higher than the threshold value Vth1, the comparator 12 increases the voltage level of the output signal S12. On the other hand, when the voltage level Vin of the differential signal SD falls to become lower than the threshold value −Vth1, the comparator 12 reduces the voltage level of the output signal S12.

The output signal S12 is inverted by the NOT circuit 14, and the inverted signal S14 is input to the clock terminal CP of the D-FF circuit 32. The output signal S14 is inverted by the NOT circuit 16, and the inverted signal S16 is input to the clock terminal CP of the D-FF circuit 34. That is, the D-FF circuit 32 and the D-FF circuit 34 operate based on the clock signals having opposite phases.

On the other hand, as shown in FIG. 3C, when the voltage level Vin of the differential signal SD shown in FIG. 3A rises to become higher than the threshold value Vth2, the comparator 22 provided in parallel with the comparator 12 increases the voltage level of the output signal S22. On the other hand, when the voltage level Vin of the differential signal SD falls to become lower than the threshold value −Vth2, the comparator 22 reduces the voltage level of the output signal S22. The threshold value Vth2 is larger than the threshold value Vth1. Accordingly, when the differential signal SD has an amplitude exceeding the threshold value Vth2, the signal S22 rises after the rising of the signal S12 and the signal S22 falls after the falling of the signal S12, as shown in FIGS. 3B and 3C. Both of the signals S12 and S22 are alternately switched between high and low levels at periods (pulse width) corresponding to the rotation period of the object.

Then, as shown in FIG. 3E, the D-FF circuit 32 generates the signal S32 holding the level of the signal S24 at the rising timing of the signal S14 (falling timing of the signal S16), and outputs the signal S32 to the XOR circuit 42.

On the other hand, as shown in FIG. 3D, the D-FF circuit 34 generates the signal S34 holding the level of the signal S24 at the rising timing of the signal S16, and outputs the signal S34 to the XOR circuit 42.

Then, as shown in FIG. 3F, the XOR circuit 42 generates the determination signal S42 indicating the exclusive OR of the signal S32 from the D-FF circuit 32 and the signal S34 from the D-FF circuit 34.

As shown in FIGS. 3A, 3B, and 3C, when the voltage level of the differential signal SD between the signals S1 and S2 is higher than the threshold value Vth2, the logic level of the signal S24 at the rising timing of the signal S16 is different from the logic level of the signal S24 at the falling timing of the signal S16. That is, the logic level of the output signal S32 of the D-FF circuit 32 is different from the logic level of the output signal S34 of the D-FF circuit 34. Therefore, by generating the determination signal S42 indicating the exclusive OR of the signals S32 and S34 in the XOR circuit 42, it can be seen that the voltage level of the differential signal SD is higher than the threshold value Vth2 when the determination signal S42 is at a high level and the voltage level of differential signal SD is lower than the threshold value Vth2 when the determination signal S42 is at a low level. That is, it can be seen that the distance between the sensor 10 and the object is within a predetermined range when the determination signal S42 is at a high level.

SECOND OPERATION EXAMPLE

FIGS. 4A to 4F are waveform diagrams of respective signals of the gap detection circuit 1 when the voltage level of the differential signal SD between the signals S1 and S2 exceeds the threshold Vth1 but does not exceed the threshold Vth2. FIG. 4A is a waveform diagram of the differential signal SD between the signals S1 and S2. FIG. 4B is a waveform diagram of the output signal S16 of the NOT circuit 16. FIG. 4C is a waveform diagram of the output signal S24 of the NOT circuit 24. FIG. 4D is a waveform diagram of the output signal S34 of the D-FF circuit 34. FIG. 4E is a waveform diagram of the output signal S32 of the D-FF circuit 32. FIG. 4F is a waveform diagram of the determination signal S42 of the XOR circuit 42.

As shown in FIG. 4A, the differential signal SD becomes higher than the threshold value Vth1, but does not become higher than the threshold value Vth2. As shown in FIG. 4B, when the voltage level Vin of the differential signal SD shown in FIG. 4A rises to become higher than the threshold value Vth1, the comparator 12 increases the voltage level of the output signal S12. On the other hand, when the voltage level Vin of the differential signal SD falls to become lower than the threshold value −Vth1, the comparator 12 reduces the voltage level of the output signal S12.

Therefore, as shown in FIG. 4B, the output signal S16 is switched between high and low levels at a pulse width corresponding to the rotation period of the object.

On the other hand, as shown in FIG. 4C, the comparator 22 generates the output signal S22 indicating a low level at all times since the voltage level Vin of the differential signal SD shown in FIG. 4A does not reach the threshold value Vth2.

Then, as shown in FIG. 4E, the D-FF circuit 32 generates the signal S32 holding the level of the signal S24 at the rising timing of the signal S14 (falling timing of the signal S16), and outputs the signal S32 to the XOR circuit 42. In this case, the signal S32 is always at a low level.

As shown in FIG. 4D, the D-FF circuit 34 generates the signal S34 holding the level of the signal S24 at the rising timing of the signal S16, and outputs the signal S34 to the XOR circuit 42. In this case, the signal S34 is always at a low level.

Then, as shown in FIG. 4F, the XOR circuit 42 generates the determination signal S42 indicating the exclusive OR of the signal S32 from the D-FF circuit 32 and the signal S34 from the D-FF circuit 34. In this case, since both of the signals S32 and S34 are always at a low level, the determination signal S42 indicates a low level at all times. When the determination signal S42 is at a low level, it can be seen that the distance between the sensor 10 and the object is not within a predetermined range.

When the voltage level of the differential signal SD between the signals S1 and S2 is lower than the threshold value Vth1, the D-FF circuits 32 and 34 do not operate and the determination signal S42 is invalid.

As described above, according to the gap detection circuit 1 of the present embodiment, it is possible to generate the determination signal S42 without using a sample and hold circuit. Therefore, it is possible to perform high-speed processing. According to the gap detection circuit 1, input signals having the same level are input to the comparators 12 and 22, unlike in the flash type ADC. Therefore, there is little influence due to the performance difference between the comparators 12 and 22, and the size can be reduced. In addition, since the input signal is not divided, there is little influence of noise.

The present invention is not limited to the embodiment described above. That is, those skilled in the art may perform various changes, combinations, sub-combinations, and replacement of the components in the embodiment described above within the technical range of the present invention or within the range of the equivalents thereof. In the embodiment described above, the case has been exemplified in which two comparators 12 and 22 having different hysteresis are provided in parallel. For example, one or more comparators having larger hysteresis than the comparator 22 or one or more comparators having smaller hysteresis than the comparator 12 may be further provided in parallel with the comparators 12 and 22. In this manner, it is possible to increase the detectable gap range.

In addition, the logic circuit based on the NOT circuits 14, 16, and 24, the D-FF circuits 32 and 34, and the XOR circuit 42 shown in FIG. 1 is not limited in particular as long as the logic circuit generates a determination signal using a difference between the hysteresis characteristics of the comparators 12 and 22.

In the embodiment described above, the case has been exemplified in which a signal from the sensor 10 that detects the rotation of a component (object) of a vehicle in a non-contact manner is processed. However, the present invention can also be applied to a case where processing is performed based on a differential signal from a component other than a sensor.

The present invention can be applied to a sensor system that determines whether or not the signal level is within a predetermined width.

It should be understood by those skilled in the art that various modifications, combinations, sub-combinations and alterations may occur depending on design requirements and other factors insofar as they are within the scope of the appended claims of the equivalents thereof.

What is claimed is:

1. A signal processing circuit, comprising:
a first comparator having a first hysteresis characteristic having a first hysteresis width, the first comparator comparing a first input signal and a second input signal and outputting a first output signal according to a comparison result and the first hysteresis characteristic, the first and second input signals form a differential pair providing a differential signal;
a second comparator having a second hysteresis characteristic having a second hysteresis width, the second hysteresis characteristic being different from the first hysteresis characteristic, the second comparator comparing the first input signal and the second input signal and outputting a second output signal according to a comparison result and the second hysteresis characteristic; and
a signal generating circuit configured to generate a determination signal based on the first and second output signals, the determination signal indicating whether or not an amplitude of the differential signal satisfies predetermined conditions,
wherein the first hysteresis is being narrower than the second hysteresis width and the signal generating circuit generates the determination signal based on levels of the second output signal at rising and falling edges of the first output signal.

2. A signal processing circuit, comprising:
a first comparator having a first hysteresis characteristic, the first comparator comparing a first input signal and a second input signal and outputting a first output signal according to a comparison result and the first hysteresis characteristic, the first and second input signals form a differential pair providing a differential signal;
a second comparator having a second hysteresis characteristic different from the first hysteresis characteristic, the second comparator comparing the first input signal and the second input signal and outputting a second output signal according to a comparison result and the second hysteresis characteristic; and a signal generating circuit configured to generate a determination signal based on the first and second output signals, the determination signal indicating whether or not an amplitude of the differential signal satisfies predetermined conditions, wherein the first comparator inverts a logic level of the first output signal when a level of the first input signal becomes higher than a level of the second input signal by an amount greater than a first threshold value, and inverts the logic level of the first output signal when the level of the second input signal becomes higher than the level of the first input signal by an amount greater than a second threshold value, and the second comparator inverts a logic level of the second output signal when the level of the first input signal becomes higher than the level of the second input signal by an amount greater than a third threshold value higher than the first threshold value, and inverts the logic level of the second output signal when the level of the second input signal becomes higher than the level of the first input signal by an amount greater than a fourth threshold value higher than the second threshold value.

3. A sensor system, comprising:

the signal processing circuit of claim 2; and a sensor configured to detect a rotation of an object in a non-contact manner and generate the first input signal and the second input signal which form the differential pair providing the differential signal according to a detection result.

4. A signal processing circuit, comprising:

a first comparator having a first hysteresis characteristic, the first comparator comparing a first input signal and a second input signal and outputting a first output signal according to a comparison result and the first hysteresis characteristic, the first and second input signals form a differential pair providing a differential signal;

a second comparator having a second hysteresis characteristic different from the first hysteresis characteristic, the second comparator comparing the first input signal and the second input signal and outputting a second output signal according to a comparison result and the second hysteresis characteristic; and a signal generating circuit configured to generate a determination signal based on the first and second output signals, the determination signal indicating whether or not an amplitude of the differential signal satisfies predetermined conditions, wherein the signal generating circuit generates the determination signal having a predetermined logic level when a logic level of the second output signal at a rising edge of the first output signal is different from a logic level of the second output signal at a falling edge of the first output signal.

5. A sensor system, comprising:

the signal processing circuit of claim 4; and a sensor configured to detect a rotation of an object in a non-contact manner and generate the first input signal and the second input signal which form the differential pair providing the differential signal according to a detection result.

6. A signal processing circuit, comprising:

a first comparator having a first hysteresis characteristic, the first comparator comparing a first input signal and a second input signal and outputting a first output signal according to a comparison result and the first hysteresis characteristic, the first and second input signals form a differential pair providing a differential signal;

a second comparator having a second hysteresis characteristic different from the first hysteresis characteristic, the second comparator comparing the first input signal and the second input signal and outputting a second output signal according to a comparison result and the second hysteresis characteristic; and a signal generating circuit configured to generate a determination signal based on the first and second output signals, the determination signal indicating whether or not an amplitude of the differential signal satisfies predetermined conditions, wherein the signal generating circuit includes:

a first flip-flop circuit having a first clock pulse terminal that receives an inverted signal of the first output signal, a first data input terminal that receives an inverted signal of the second output signal, and a first output terminal;

a second flip-flop circuit having a second clock pulse terminal that receives the first output signal, a second data input terminal that receives the inverted signal of the second output signal, and a second output terminal; and a logic circuit that outputs, as the determination signal, an exclusive OR of an output signal from the first output terminal and an output signal from the second output terminal.

7. A sensor system, comprising:

the signal processing circuit of claim 6; and a sensor configured to detect a rotation of an object in a non-contact manner and generate the first input signal and the second input signal which form the differential pair providing the differential signal according to a detection result.

8. A sensor system, comprising:

the signal processing circuit of claim 1; and a sensor configured to detect a rotation of an object in a non-contact manner and generate the first input signal and the second input signal which form the differential pair providing the differential signal according to a detection result.

* * * * *